United States Patent
Manabe et al.

(10) Patent No.: US 6,925,922 B2
(45) Date of Patent: Aug. 9, 2005

(54) APPARATUS FOR REMOVING TIEBARS AFTER MOLDING OF SEMICONDUCTOR CHIP

(75) Inventors: Hidekazu Manabe, Tokyo (JP); Kenta Matsunaga, Kikuchi-gun (JP)

(73) Assignee: Renesas Technology Corp., Tokyo (JP)

( * ) Notice: Subject to any disclaimer, the term of this patent is extended or adjusted under 35 U.S.C. 154(b) by 188 days.

(21) Appl. No.: 10/281,045

(22) Filed: Oct. 25, 2002

(65) Prior Publication Data

US 2003/0079734 A1 May 1, 2003

(30) Foreign Application Priority Data

Oct. 31, 2001 (JP) ........................................ 2001-333946

(51) Int. Cl.[7] .............................................. B26D 7/18
(52) U.S. Cl. ............................ 83/694; 83/695; 225/97
(58) Field of Search ......................... 83/78, 929.2, 695, 83/694, 636, 103, 125, 942; 223/103, 104; 225/2, 97

(56) References Cited

U.S. PATENT DOCUMENTS

| | | | | |
|---|---|---|---|---|
| 412,618 A | * | 10/1889 | Holz ............................. | 83/25 |
| 3,500,710 A | * | 3/1970 | Taber ........................... | 83/588 |
| 4,175,686 A | * | 11/1979 | Lang ............................ | 225/97 |
| 4,220,272 A | * | 9/1980 | Danti ............................ | 225/2 |
| 4,866,976 A | * | 9/1989 | Hinterlechner ............... | 72/456 |
| 4,972,572 A | * | 11/1990 | Kimura et al. ............. | 29/564.3 |
| 5,291,814 A | * | 3/1994 | Fierkens ..................... | 83/685 |
| 5,857,397 A | * | 1/1999 | Matsubayashi et al. ....... | 83/556 |
| 6,003,418 A | * | 12/1999 | Bezama et al. ............... | 83/98 |
| 6,065,381 A | * | 5/2000 | Kim et al. .................... | 83/98 |
| 6,341,549 B2 | * | 1/2002 | Kim ............................ | 83/99 |

FOREIGN PATENT DOCUMENTS

| | | |
|---|---|---|
| JP | 5-102370 | 4/1993 |
| JP | 9-293816 | 11/1997 |
| JP | 11-354551 | 12/1999 |

* cited by examiner

Primary Examiner—Allan N. Shoap
Assistant Examiner—Omar Flores Sánchez
(74) Attorney, Agent, or Firm—Leydig, Voit & Mayer, Ltd.

(57) ABSTRACT

An apparatus for removing tiebars of a lead frame after one or more semiconductor components have been encapsulated in a resin to form a package body includes first and second removing stations. The second removing station is provided for removing scraps that may be left between leads of the lead frame after the tiebars have been removed in the first removing station. In the second removing station, the lead frame is positioned on a die. A scrap-cutting punch is moved relative to the die so that projections of the punch are fitted into corresponding holes of the die, thereby pushing the scraps out of the leads and into the holes.

5 Claims, 10 Drawing Sheets

APPARATUS FOR REMOVING TIEBARS AFTER MOLDING OF SEMICONDUCTOR CHIP

TECHNICAL FIELD

The present invention relates generally to a process for manufacturing a semiconductor chip package and, in particular, to a semiconductor chip package using a lead frame having tiebars.

BACKGROUND OF THE INVENTION

FIG. 10A illustrates a conventional packaged semiconductor device having a resin package body in which one or more semiconductor components are encapsulated and a plurality of leads each connected electrically with the components and projecting outwardly from the package body. In the molding, semiconductor components on a lead frame L of the semiconductor device are encapsulated with resin to form a package body 2. As shown in FIG. 10B, the leads are connected with the lead frame L and also connected with the neighboring lead or leads 3 through a bridge or tiebar 4 leaving a small gap from a periphery of the package body to be molded. During the encapsulation process, the tiebars 4 are supposed to function as a barrier to minimize resin leaking from a small opening defined between upper and lower mold halves. Disadvantageously, the resin leaking out of the opening and then stopped by the tiebars 4 forms unnecessary residual resin or flashing 5 which should be removed afterwards together with the tiebars 4.

For this purpose, a press cutting mechanism is provided on a downstream side of the molding in the manufacturing process. In general, the cutting mechanism has a die on which the lead frame L is placed. The die has a plurality of holes defined in a surface adjacent to the packaged device at respective portions opposing the tiebars 4 and residuals 5 when the lead frame L is positioned in place on the die. The cutting mechanism also has a plurality of press cutters provided above the die. The cutters are designed to move in and out of the corresponding holes so that the tiebars 4 and residuals 5 are cut or punched out into the holes and removed from the package body 2, as shown in FIG. 10C.

With the arrangement, the tiebars 4 and residuals 5 are well removed from the package body 2. However, some of the cut portions or scraps can adhere to the cutters after the cutoff operation and, as a result, be brought back with the cutters moving out of the holes and then clog neighboring leads 3, which results in an unwanted short-circuit of the leads 3 and lowers the productivity of the device.

SUMMARY OF THE INVENTION

Hence, it is an object of the present invention to provide an apparatus and method for removing tiebars without leaving any scraps in the lead frame.

It is another object of the present invention to provide a method for manufacturing a semiconductor device capable of removing tiebars with high reliability.

To achieve the above object, an apparatus of the present invention for removing tiebars of a lead frame after one or more semiconductor components have been molded to form a package body attached to the lead frame includes first and second removing stations. The first removing station includes first and second support members opposed to each other capable of putting the lead frame therebetween; and a tiebar-cutting punch held by the first support member for reciprocation relative to the first support member. The tiebar-cutting punch and second support member have projections or cutters and holes, respectively, engageable with each other. In the process, the lead frame is positioned in place, the lead frame is put between the first and second support members, and then the cutters are fitted into the corresponding holes in the second support, thereby punching out the tiebars. The second removing station includes third and fourth support members opposed to each other capable of putting the lead frame therebetween; and a scrap-removing punch held by the third support member for reciprocation relative to the third support member for removing the possible scraps left in between the leads of the lead frame after the tiebars have been removed in the first removing station. The scrap-removing punch and fourth support member have projections and holes, respectively, engageable with each other. In the process, the lead frame is positioned in place, the lead frame is put between the third and fourth support members, and then the scrap-removing punch is moved relative to the fourth support member so that the projections are fitted into the corresponding holes in the fourth support member, thereby pushing the possible scraps out of the lead frame to the holes.

According to the removing apparatus, after the tiebars (and the residuals) are removed in the first removing station, the possible scraps left in between the leads are removed in the second station. Therefore, the tiebars (and the residuals) can be positively removed.

Note that, although according to the present invention the residuals as well as the tiebars can be removed as described above, reference is not made hereinafter to the removal of the residuals and the cut portions thereof for the sake of descriptive simplicity.

A method according to the present invention for removing tiebars of a lead frame after one or more semiconductor components have been molded to form a package body attached to the lead frame includes the steps of preparing a support member and cutters, the member being formed with holes engageable with the cutters; positioning the lead frame in place on the support member; moving the cutters relative to the support member so that the cutters are fitted into the holes of the support member, thereby punching out the tiebars; and removing the possible scraps left in between the leads of the lead frame after the moving step.

According to the removing method, after the tiebars are removed, the scraps that may be left in between the leads are removed. Therefore, the tiebars can be positively removed.

A method according to the present invention for manufacturing a semiconductor device includes the steps of molding one or more semiconductor components positioned on a lead frame to form a package body; removing remaining gates after the semiconductor components have been molded; and removing tiebars after the remaining gates have been removed. The step of removing the tiebars includes the steps of positioning the lead frame in place on a support member formed with holes; moving cutters relative to the support member so that the cutters are fitted into the corresponding holes of the support member, thereby punching out the tiebars; and removing the possible scraps left in between the leads of the lead frame after the moving step.

According to the manufacturing method in which the "remaining gates" are removed before the removing process of the tiebars, components in the first and/or second removing station are prevented from being damaged because of the remaining gates during the removing process of the tiebars and/or scraps. Therefore, a high reliable removing operation of the tiebars can be performed.

BRIEF DESCRIPTION OF THE DRAWINGS

Corresponding reference numbers indicate corresponding parts throughout the several views of the drawings.

DETAILED DESCRIPTION OF THE PREFERRED EMBODIMENTS

Figure 1:
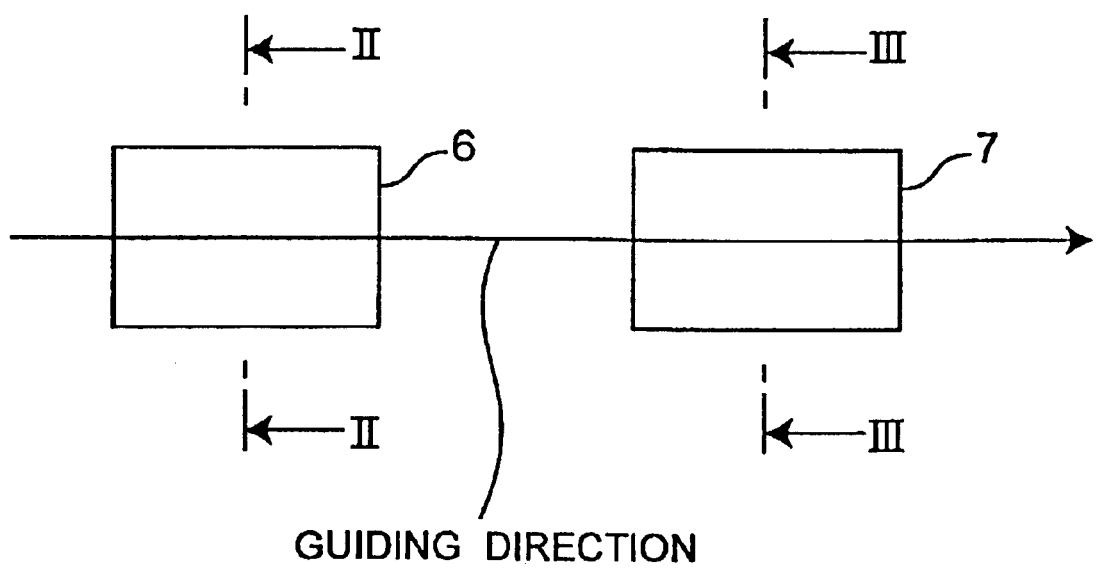
FIG. 1 is a schematic view of the tiebar-removing device according to the present invention.

FIG. 1 shows schematically an embodiment of a tiebar-removing device according to the present invention. The device has a first removing station 6 for removing tiebars after a molding process and a second removing station 7 downstream of the station 6 with respect to the guiding direction of the lead frame for removing scraps that may be left in between leads after the first removing station 6 has removed the tiebars.

Figure 2:
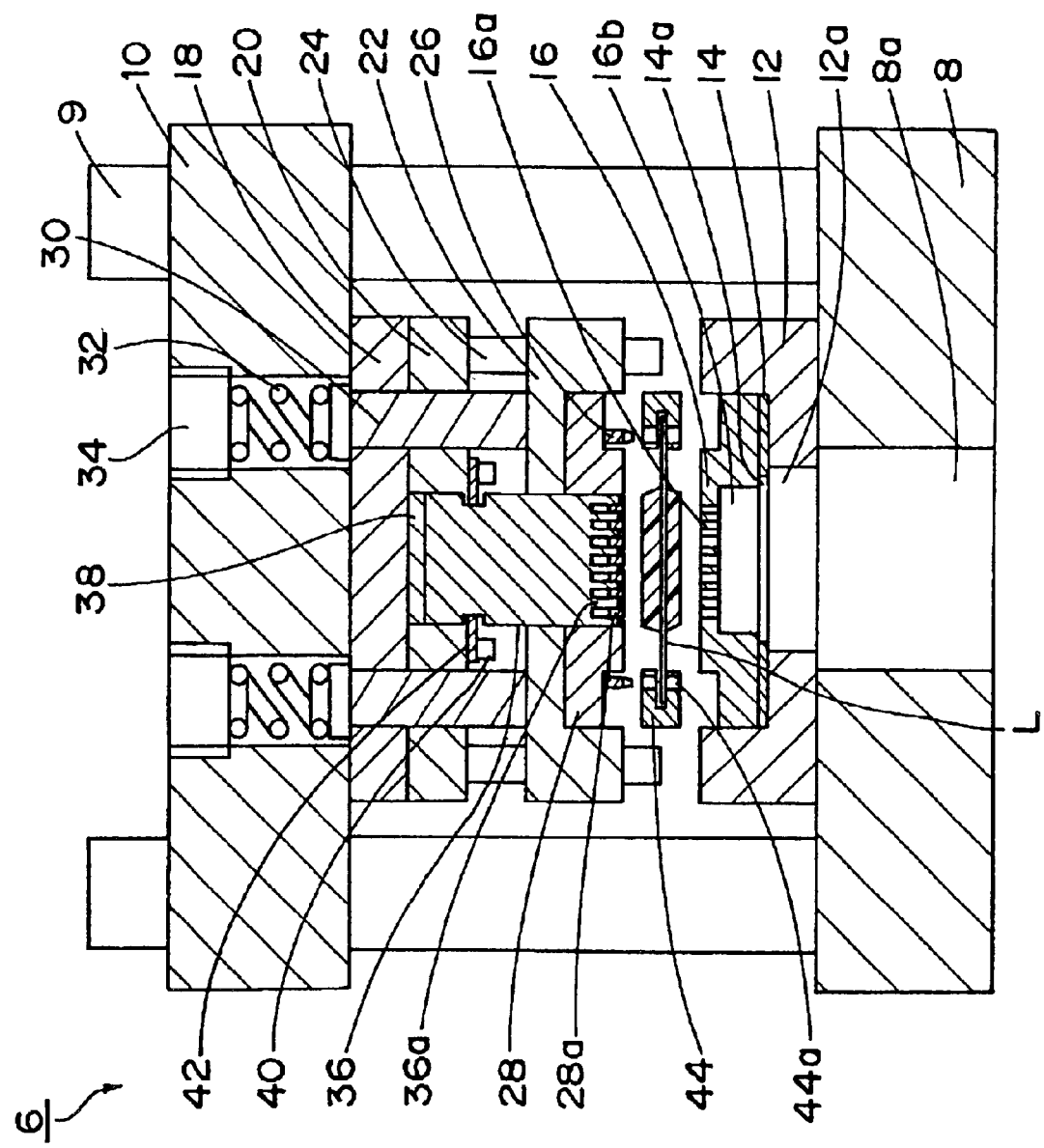
FIG. 2 is a cross sectional view of a first removing station, taken along line the II—II in FIG. 1, which is perpendicular to a guiding direction of a lead frame.

Referring to FIG. 2, the first removing station 6 includes a lower die set 8, to which guide posts 9 extending in the vertical direction are fixed. An upper die set 10 is supported on the guide posts 9 for vertical movement relative to and along the guide posts 9.

A die plate 12 is fixed on the lower die set 8. A tiebar-cutting die 16 is removably mounted through a spacer 14 on the die plate 12. The die 16 constitutes a lower supporting member (second supporting member) which, in combination with an upper supporting member described below, serves to engage a lead frame L therebetween during the cutting process of the tiebars. In order that, where the die 16 is abraded to some extent, it is detached and polished to reuse, the spacer 14 is replaced with a new one which is thicker by the thickness of the polished portion of the die 16 to adjust the height of the top surface of the die 16. The die 16 has a plurality of through holes 16a in the upper portion which, in combination with a plurality of projections of the tiebar-cutting punch described below, serve to punch out or cut the tiebars. The hole pitch is equal to the lead pitch of the lead frame L. The through holes 16a are connected with a scrap-exhausting hole 16b formed in the lower portion of the die 16. In order to discard the cut portions or scraps of the tiebars from the device, scrap-exhausting holes 8a, 12a and 14a are formed in the lower die set 8, the die plate 12 and the spacer 14 connected with the scrap-exhausting hole 16b.

A backing plate 18 is fixed on the lower surface of the upper die set 10. On the lower surface of the backing plate 18 is fixed a punch plate 20, on which guide posts 24 extending in the vertical direction are fixed for supporting a stripper plate 22 for vertical movement. On the stripper plate 22 is fixed a stripper piece 28, on the lower surface of which pilot pins 26 are mounted in place. The stripper piece 28 constitutes an upper supporting member (first supporting member) which, in combination with the lower supporting member, serves to engage the lead frame L therebetween during the cutting process of the tiebars.

On the upper surface of the stripper plate 22 are fixed one ends of push rods 30, which are extended in the vertical direction through the backing plate 18 and punch plate 20. The other ends of the push rods 30 are connected with respective coil springs 32 provided within the upper die set 10 for biasing the push rods 30 downwardly. In the drawing, reference number 34 indicates a bolt for incorporating the respective coil spring 32 in the upper die set 10.

The first removing station 6 includes a tiebar-cutting punch 36. The punch 36 has a plurality of projections or cutters 36a which, in combination with the through holes 16a of the die 16, serve to punch out the tiebars. For this purpose, the size and pitch of the projections 36a are designed so that they are capable of being fitted into the corresponding through holes 16a of the die 16.

The punch plate 20 is formed with an opening for incorporating therein and holding the upper part of the tiebar-cutting punch 36. A spacer 38 is provided between the upper end of the punch 36 and the backing plate 18. In order that, where the punch 36 is abraded to some extent, it is detached and polished to reuse, the spacer 38 is replaced with a new one which is thicker by the thickness of the polished portion of the punch 36 to adjust the height of the lowermost surface of the punch 36. The punch 36 is removably attached to the punch plate 20 by means of punch holders 42, each of which is fastened by a bolt 42.

The stripper piece 28 is provided with a plurality of guides 28a that are fitted in the respective recesses between the adjacent projections 36a of the punch 36. The guides 28a are designed with a high degree of geometrical accuracy so that they can guide the projections 36a of the punch 36 without rocking in the transverse direction when the punch 36 is moved in the vertical direction relative to the stripper piece 28 as will be described hereinafter.

A pair of opposing guide rails 44 is provided between the die 16 and stripper piece 28 for guiding the lead frame L from a molding device (not shown) to the first removing station 6 and then to the second removing station 7. The guide rails 44 have a plurality of through holes 44a for receiving the pilot pins 28 of the stripper piece 28 to position the lead frame L relative to the stripper piece 28. The guide rails 44 are designed so that it can be moved in the vertical direction between a home position shown where they are located between and spaced from the die 16 and stripper piece 28 and a tiebar-removing position where they are sandwiched between the die 16 and stripper piece 28. As described below, the downward movement of the stripper piece 28 allows the guide rails 44 to be pressed by the stripper piece and move downwardly to the tiebar-removing position.

Figure 3:
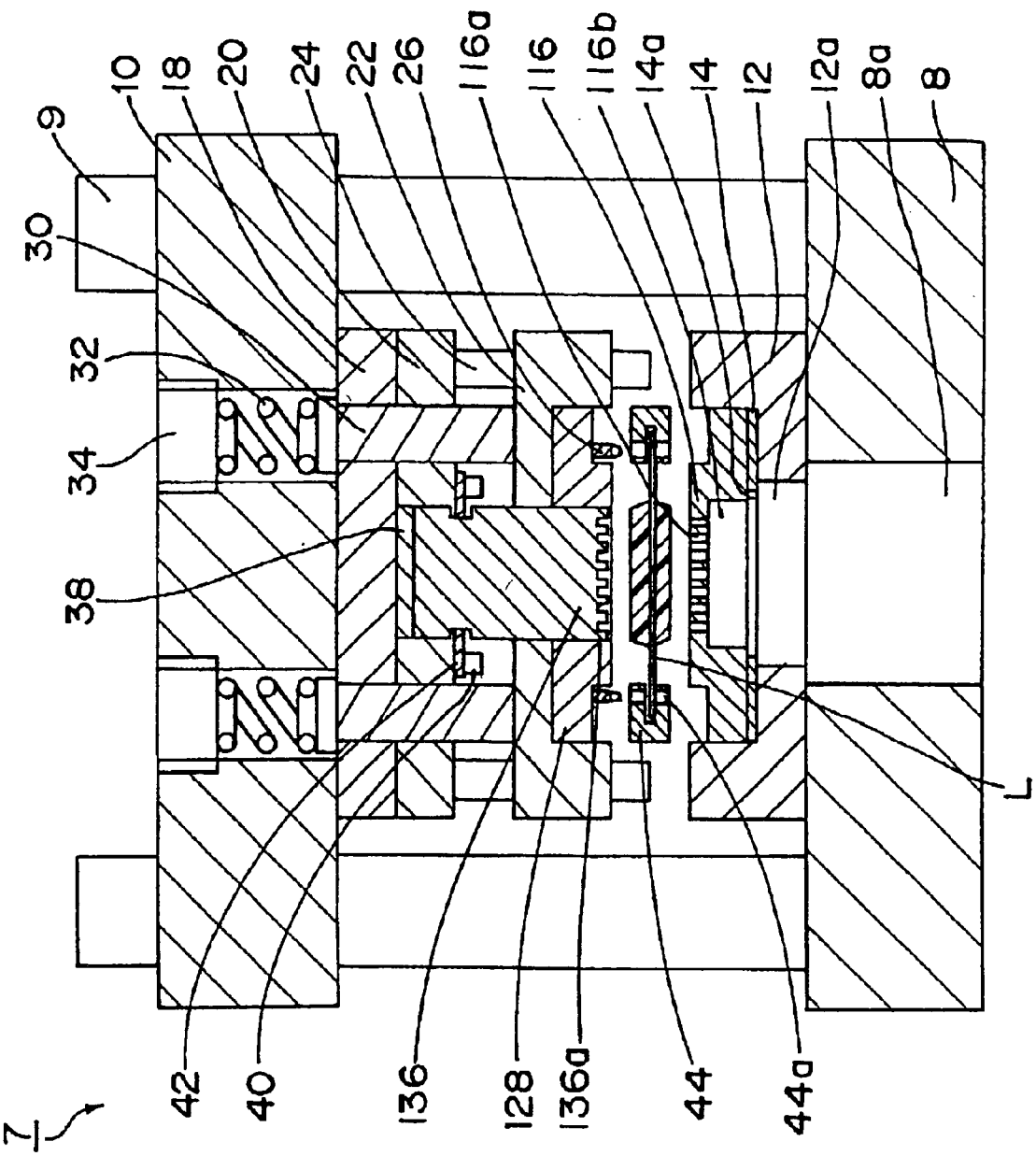
FIG. 3 is a cross sectional view of a second removing station, taken along the line III—III in FIG. 1, which is perpendicular to a guiding direction of a lead frame.

Referring to FIG. 3, the second removing station 7 is similar to the first removing station 6 except for the details described hereinafter. Specifically, the second removing station 7 includes a scrap-removing punch 136 with projections 136a that are capable of fitting into corresponding through holes 116a of a die 116 to push out the scraps that may clog between the leads and drop them to a scrap-exhausting hole 116b formed in the die 116. The stripper piece 128 and die 116 constitute an upper or third supporting member and a lower or fourth supporting member, respectively, to put the lead frame L therebetween during the removing process of the scraps.

Figure 4A:
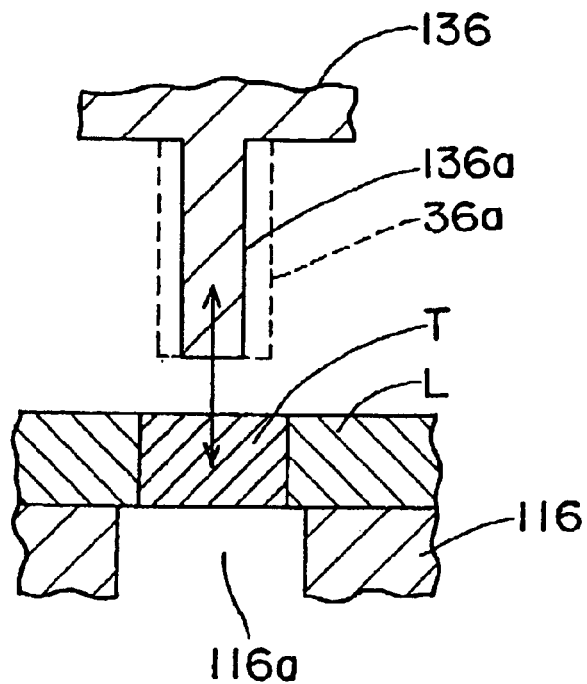
FIG. 4A is an enlarged cross sectional view of punching projections of the second removing station.
Figure 4B:
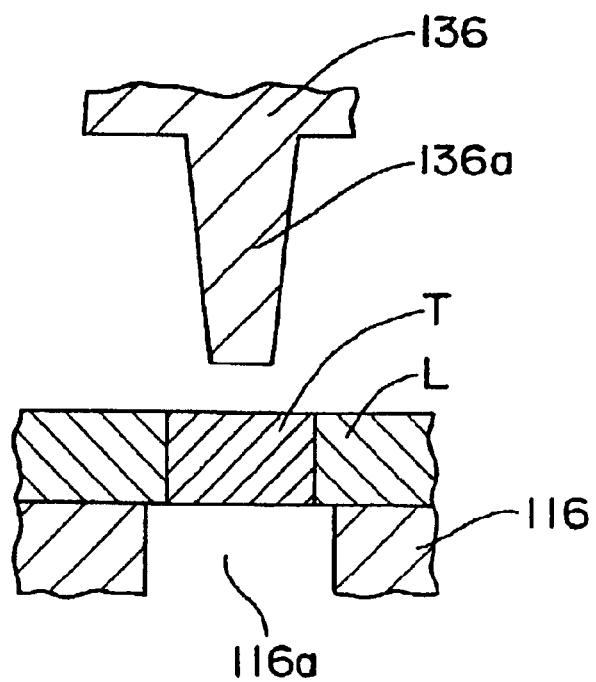
FIG. 4B is an enlarged cross sectional view of a variant of punching projections of the second removing station.

It should be noted that the projections 136a of the second removing station 7 need not function as cutters, unlike the first removing station 6. Each of the projections 136a may have a cross section identical to that of the projection 36a in the first removing station 7 (and thus the tiebar portion to be cut by each projection 36a). However, each of the projections 136a may be designed so that it has a cross section smaller than that of the projection 36a in the first removing station 7 (and thus the tiebar portion to be cut by each projection 36a) as shown in FIG. 4A, as long as the cross section of the projection 136a is large enough to push out the scraps T caught in between the leads. Preferably, as shown in FIG. 4B, the projections 136a may be tapered in the downward direction to improve the strength thereof. In addition, the punch 136 (or at least the projections 136a thereof) may be formed with resin, so that the lead frame L is prevented from being damaged in case where the lead frame L and projections 136a may interfere with each other during the removing process of the scraps T.

The punch 36 of the first removing station 6 is aligned and guided with high accuracy by the guides 28a of the stripper piece 28 that are fitted in between the corresponding adjacent projections 36a of the punch 36. On the other hand, the punch 136 of the second removing station 7 can remove the scraps that may be left in between the leads even if the alignment accuracy of the projections 136a is lower than that of the projections 36a. Therefore, guiding portions such as the guides 28a may be omitted in the stripper piece 128 and only the periphery of the punch 136 may be guided by the stripper piece 128, as shown in FIG. 3. This result in the constructional simplicity of the stripper piece 128, providing a tiebar-removing device at lower cost.

The operation of the tiebar-removing device will now be described. Referring to FIG. 2, the lead frame L is guided along the guide rails 44 and transported to the region above the die 16 of the first removing station 6. Next, the upper die set 10 is moved downwardly in the vertical direction along the guide posts 9. Accordingly, the stripper plate 22 and stripper piece 28 fixed thereto are moved downwardly in the vertical direction along the guide posts 24, so that the pilot pins 26 on the lower surface of the stripper piece 28 are inserted through the holes 44a of the guide rails 44 into corresponding locating holes not shown in the lead frame L. As the lead frame is positioned relative to the stripper piece 28, the stripper piece 28 presses the guide rails 44 downwardly.

Figure 5:
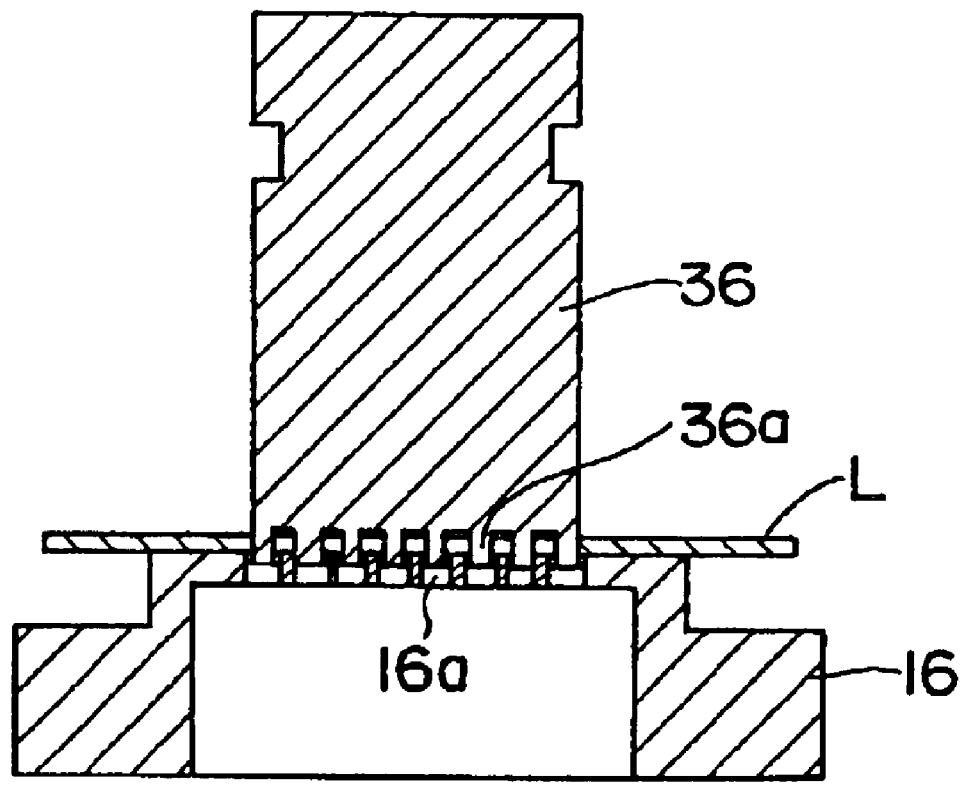
FIG. 5 is a schematic diagram showing projections of a tiebar-cutting punch, fitted into corresponding through holes of a die in the first removing station.

The further downward movement of the upper die set 10 brings the stripper piece 28 in touch with the die 16 to press the lead frame L toward the die 16. With the additional downward movement of the upper die set 10, the stripper piece 28 presses the compressed coil springs 32 via the respective push rods 30, which in turn increases the reaction force to compress the lead frame L toward the die 16. The punch 36 is also moved downwardly along the guides 28a of the stripper piece 28 so that the through holes 16a of the die 16 and the corresponding projections 36a of the tiebar-cutting punch 36 engage with each other to punch out the tiebars. FIG. 5 shows the fit of the projections 36a of the punch 36 into the corresponding through holes 16a of the die 16. The tiebars that have been cut are discarded through the exhausting holes 16b, 14a, 12a and 6a in this order out of the removing device.

Then, the upper die set 10 is moved upwardly to permit components of the first removing station 6 to operate reversely so that the guide rails 44 are returned to their home position. Note that when the punch 36 is moved upwardly to return to its original position, the stripper piece 28 prevents the lead frame L from moving upwardly together with the punch 36.

As described above, when the projections or cutters 36a of the punch 36 in the first removing station 6 are pulled out of the holes 16a of the die 16, the portions that have been cut may be lifted and caught in between the neighboring leads of the lead frame L. According to the present invention, for removal of such cut portions or scraps, the lead frame L is transported along the guide rails 44 to the second removing station 7.

The transported lead frame L is held in the second removing station 7 so that the regions in the lead frame L where the tiebars have been cut are right above the through holes 116a of the die 116 (see FIG. 4A). Then, components in the second removing station 7 are operated in the substantially same way as the corresponding components in the first removing station 6. Specifically, the projections 136a of the punch 136 are fitted into the through holes 116a of the die 116 to push out the possible scraps caught in between the leads so that they are discarded through the exhausting holes 116b, 14a, 12a and 4a in this order out of the removing device.

According to this embodiment of the tiebar-removing device, the scraps caught in between the leads in the tiebar removing process in the first removing station 6 are completely removed in the second removing station 7, which allows the yield of a semiconductor device to be improved.

Since the present invention has been described by way of the examples with reference to the accompanying drawings, it is to be noted that various changes and modifications will be effected without departing from the spirit and scope of the present invention.

Figure 6:
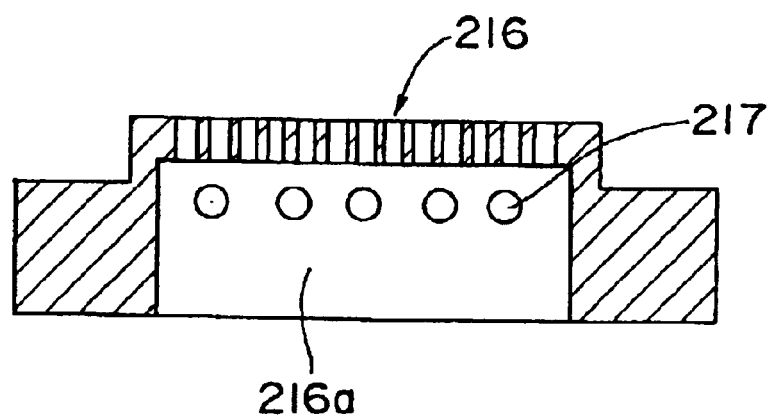
FIG. 6 is a cross sectional view of another die in the first removing station.

For example, as shown in FIG. 6, the exhausting holes 216b in the die 216 of the first removing station 6 may be connected with one or more vent holes 217 for supplying gas (e.g. air) to the projections or cutters of the punch when they are fitted in the holes of the die 216. This restrains the scraps attached on the tips of the projections from being lifted when the projections of the punch are pulled out of the holes of the die 216.

Figure 7:
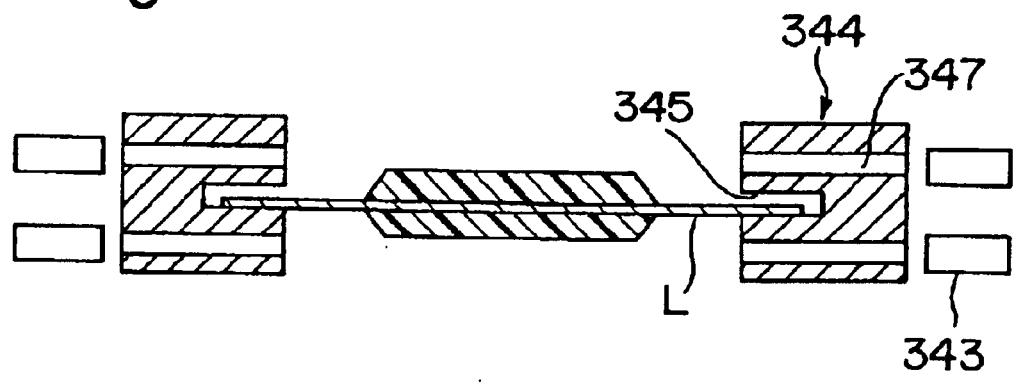
FIG. 7 is a cross sectional view of a mechanism for detecting the detachment of the lead frame.

Also, a mechanism for detecting the detachment of the lead frame L from the guide rails may be provided in the removing device in order to prevent the lead frame and/or components of the removing stations from being damaged in the tiebar- and/or scrap-removing operation. An exemplary detecting mechanism is shown in FIG. 7 in which a pair of opposing guide rails 344, which is formed with grooves 345 along which the lead frame L is guided, has openings 347 positioned above and below the corresponding grooves 345. Sensors 343 (e.g. photo sensors such as light emitters and receivers) are provided externally of the openings 345 so that they can detect the detachment of the lead frame L from the grooves 345.

As known in the art, resins may remain at the gate (which is herein referred to as "remaining gates") after the lead frame has been molded to form a package body. Therefore, when the tiebars are removed in the first removing station 6 with the resins remaining at the gate, they may damage components such as die. Accordingly, it is preferable to trim off the remaining gates before the cutting process of the tiebars in the first removing station 6.

Figure 8:
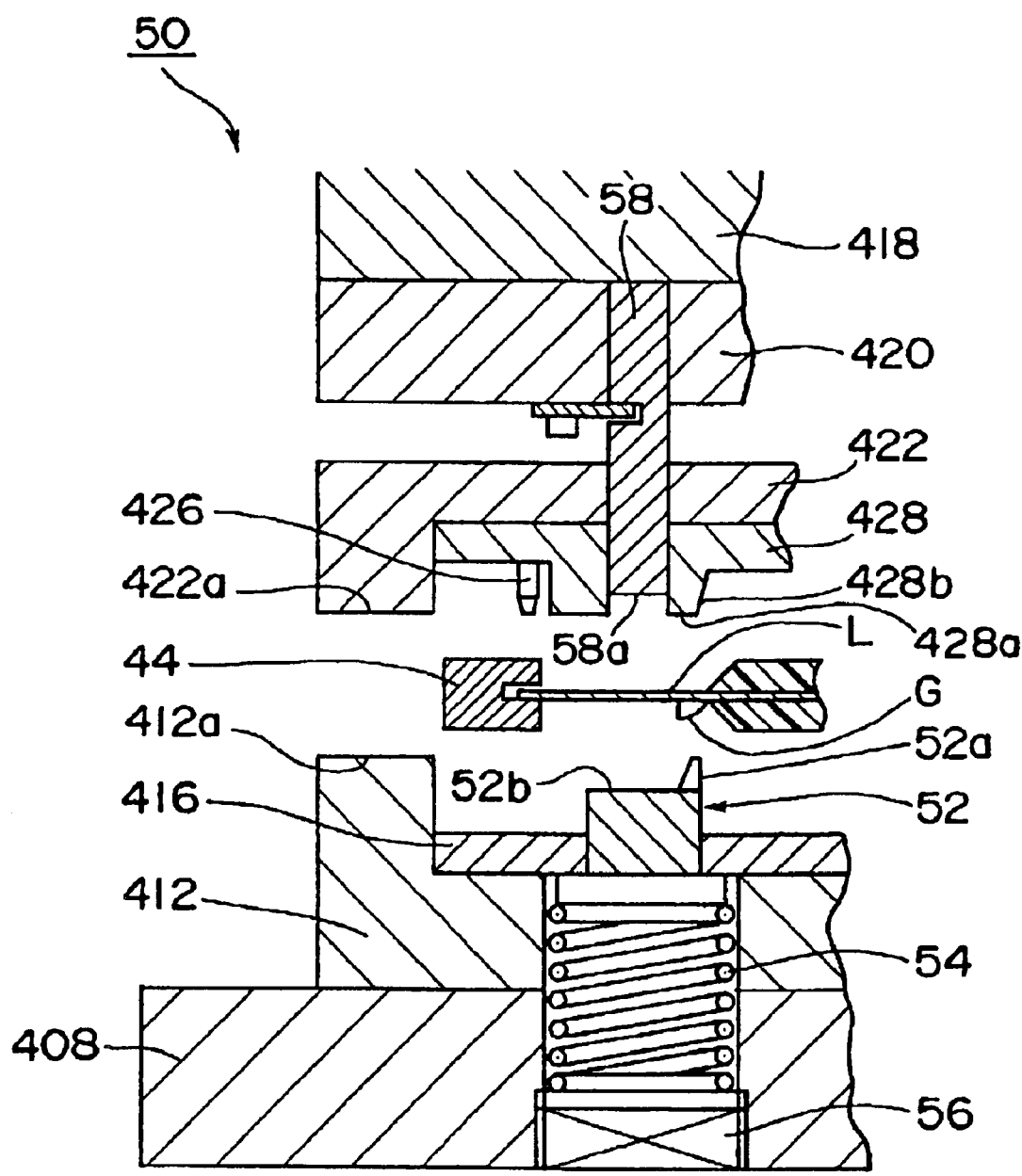
FIG. 8 is a cross sectional view of a mechanism for removing resins remaining at the gate.

FIG. 8 shows a partial cross sectional view of a gate cutting station. The station 50 has a configuration similar to that of the first removing station 6. In FIG. 8, the similar elements are indicated by reference numbers with a hundreds digit of 4. The gate cutting station 50 is configured so that it cooperates with the first and second removing stations 6 and 7. Specifically, the gate cutting, first removing and second removing stations 50, 6 and 7 are positioned in this order with respect to the guiding direction of the lead frame L, which is in the form of a ribbon and guided along the guide rails 44. The downward movement of the upper die set 10, which is a common element to the gate cutting, first removing and second removing stations 50, 6 and 7, allows the gate-, tiebar- and scrap-removing process to be simultaneously performed for respective lead frame portions positioned in place in the stations 50, 6 and 7, respectively.

The station 50 has a lifter 52 with a projection 52a opposed to the remaining gates G of the lead frame L. The lifter 52 is connected at its one end with a coil spring 54, which is provided within a hole formed in the lower die set 408, die plate 412 and die 416 for biasing the lifter 52 upwardly. In the drawing, reference number 56 indicates a bolt for incorporating the coil spring 54 in the hole.

The stripper piece 428 has a projection 428b opposed to the projections 52a of the lifter 52 so that the lead frame L transported along the guide rails 44 is interposed therebetween. The projection 52a serves to support the surface opposite the surface with the remaining gates G thereon when the stripper piece 428 is moved downwardly. By the further downward movement of the stripper piece 428, the projection 428b cooperates with the projection 52a of the lifter 52 to trim the remaining gates.

A press pin 58 is fixed to the plate 420. The press pin 58 is fitted for vertical movement in the through hole formed in the stripper plate 422 and stripper piece 428. The upper surface 52b of the lifter 52 is opposed to the lower surface 58a of the press pin 58 to make contact with the press pin 58 when the press pin 58 moves downwardly. In order to simplify an understanding of the construction, the press pin 58 is shown as if it is provided for downward movement across the lead frame L toward the lifter 52 in the drawing. However, the press pin 58 is designed so that it does not interfere with the lead frame L during its downward movement.

The lowermost surface 422a of the stripper plate 422 is set to have the substantially same height as that of the lower surface 428a of the stripper piece 428. The uppermost surface 412a of the die plate 412 is set to have the substantially same height as that of the tip of the projection 52a of the lifter 52 in its top position biased by the spring 54.

Figure 9A:
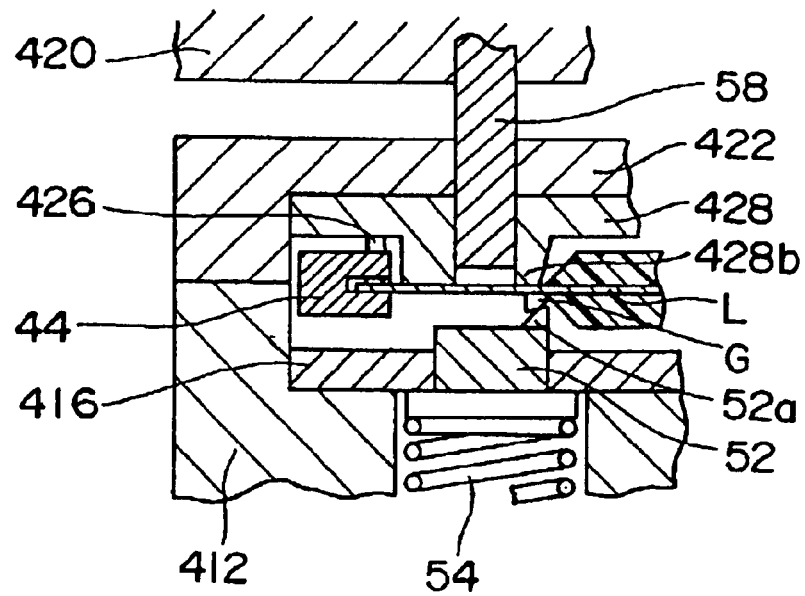
FIG. 9A is a partial cross sectional view of the mechanism in FIG. 8 in the process of cutting the remaining resins.

With the gate cutting station 50 so constructed, the lead frame L is transported along the guide rails 44 to the region above the die 416 in the gate cutting station 50. Next, the upper die set (not shown) is moved downwardly in the vertical direction along the guide posts (not shown). Accordingly, the stripper plate 426 and stripper piece 428 fixed thereto are moved downwardly in the vertical direction along the guide posts (not shown), so that the pilot pins 426 on the lower surface of the stripper piece 428 are inserted through the holes (not shown) of the guide rails 44 into corresponding locating holes (not shown) in the lead frame L. Thus, the lead frame L is brought in alignment with the stripper piece 428. Then, as shown in FIG. 9A, the die plate 412 blocks the movement of the stripper plate 422 while the projections 428b and 52a of the stripper piece 428 and lifter 52, respectively, trim off the remaining gates. At this moment, the tiebar/scrap-removing process is not performed in the removing stations 6 and 7.

Figure 9B:
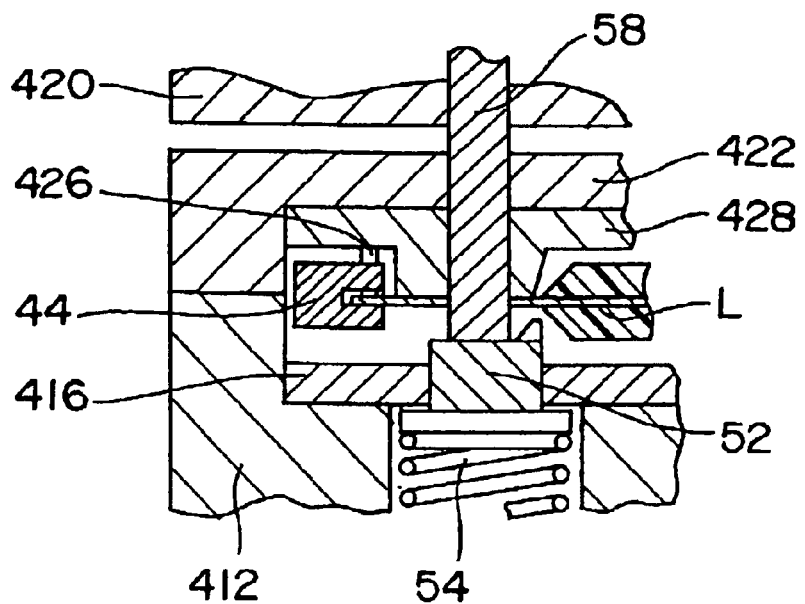
FIG. 9B is a partial cross sectional view of the mechanism in FIG. 8, which has just cut the remaining resins.
Figure 10A:
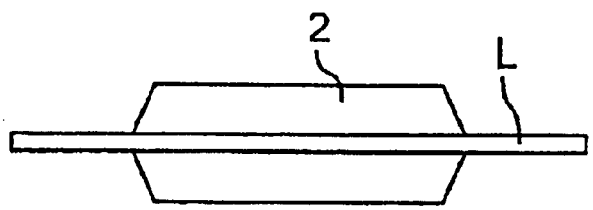
FIG. 10A is a side view of a semiconductor device having a resin molded chip.
Figure 10B:
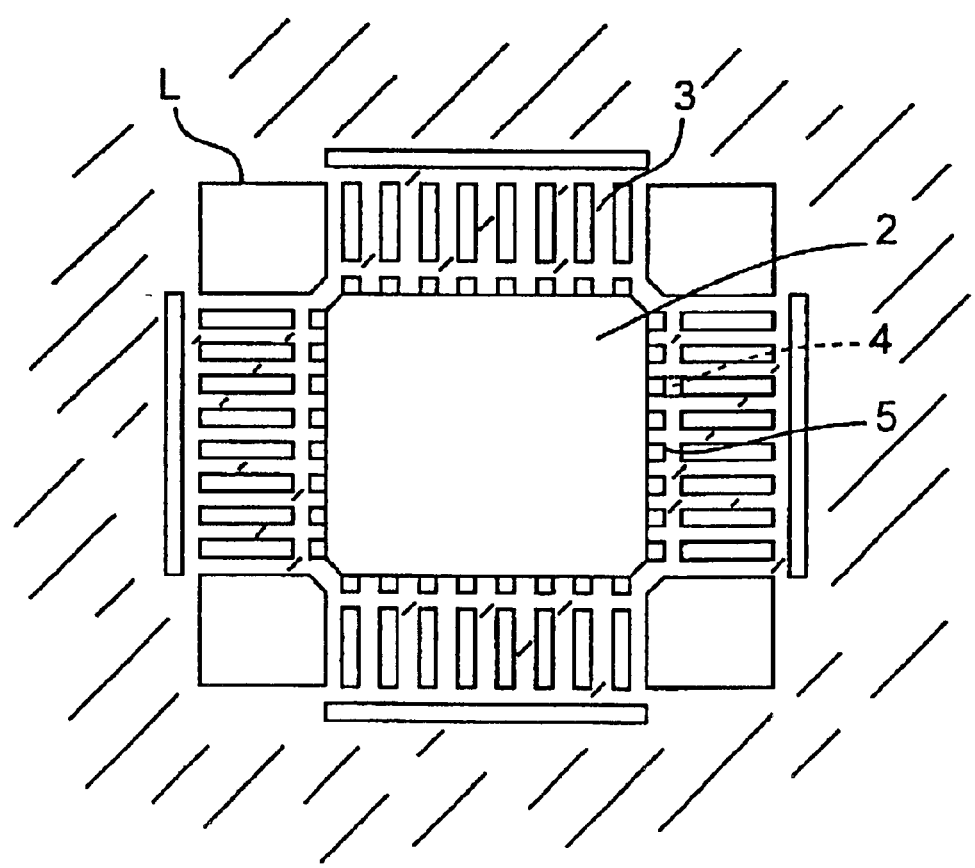
FIG. 10B is a top view of a portion of a typical lead frame having a tiebar structure.
Figure 10C:
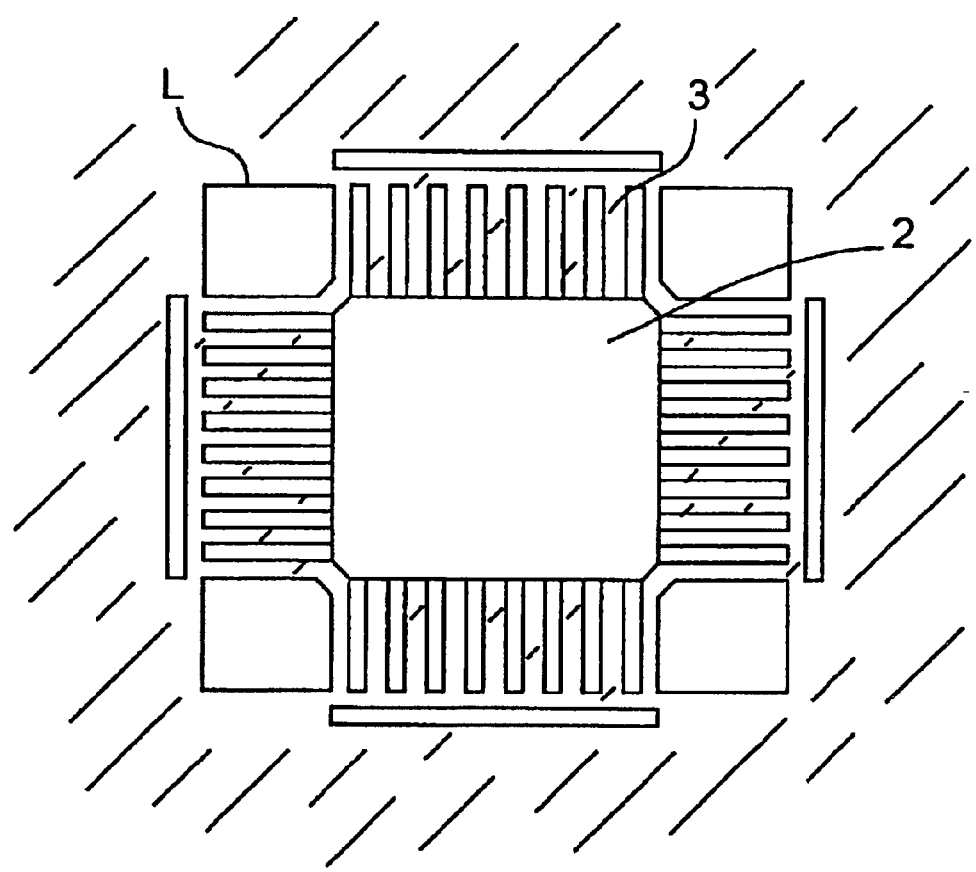
FIG. 10C is a top view of a tiebarless lead frame.

The further downward movement of the upper die set and the plate 420 fixed thereto allows the press pin 58 to be guided downwardly in the through hole formed in the stripper plate 422 and stripper piece 420. Then, as shown in FIG. 9B, the press pin 58 is brought in touch with the lifter 52, so that the lifter 52 is pushed downwardly against a biasing force provided by the spring 54 to space the projection 52a of the lifter 52 from the lead frame L.

With the projection 52a of the lifter 52 spaced away from the lead frame L to the extent that the projection 52a does not make contact with the lead frame L, the tiebar/scrap-removing process is performed for the lead frame portions in the first and second removing stations 6 and 7. Use of such gate cutting mechanism for vertical movement allows the remaining gate, tiebar and scrap removing processes to be performed with high reliability and efficiency.

According to the present invention, it is ensured in the manufacturing of a semiconductor that the tiebars are completely removed after the molding process, which result in an improved yield of the semiconductor.

What is claimed is:

1. An apparatus for removing tiebars of a lead frame after one or more semiconductor components have been encapsulated in a resin to form a package body attached to the lead frame, comprising:

a first removing station including first and second support members opposed to each other for putting the lead frame therebetween, and a tiebar-cutting punch held by the first support member for reciprocation relative to the second support member, the first support member being above the second support member, wherein the tiebar-cutting punch and second support member have cutters and holes, respectively, engageable with each other, when the lead frame is put between the first and second support members, the cutters of the tiebar-cutting punch are fitted into corresponding holes of the second support member, cutting and punching out tiebars of the lead frame, and the second support member includes a scrap-exhausting opening opposite the holes of the second support member for discharging cut portions of the tiebars cut by the tiebar-cutting punch; and a second removing station including third and fourth support members opposed to each other for putting the lead frame therebetween, and a scrap-removing punch held by the third support member for reciprocation relative to the fourth support member for removing any scraps of the tiebars left between leads of the lead frame after the tiebars have been cut in the first removing station, wherein the scrap-removing punch and fourth support member have projections and holes, respectively, engageable with each other, and when the lead frame is put between the third and fourth support members, and the scrap-removing punch is moved relative to the fourth support member, the projections of the scrap-removing punch are fitted into corresponding holes in the fourth support member, pushing the scraps of the tiebars out of the lead frame and into the holes.

2. The apparatus in accordance with claim 1, wherein the projections of the scrap-removing punch, where the projections enter the holes in the fourth support member, are tapered along a direction of relative reciprocation of the third and fourth support members.

3. The apparatus in accordance with claim 1, wherein the projections of the scrap-removing punch are made of resin.

4. The apparatus in accordance with claim 1, wherein the cutters of the tiebar-cutting punch are supplied with gas when the cutters are fitted into the corresponding holes of the second support member.

5. The apparatus in accordance with claim 1, wherein the projections of the scrap-removing punch, where the projections enter the holes in the fourth support member, have a smaller cross-sectional area than the cutters of the tiebar-cutting punch in a plane transverse to the directions of relative reciprocation of the first and second support members and of the third and fourth support members.

* * * * *